(12) United States Patent
Shimizu

(10) Patent No.: US 7,532,823 B2
(45) Date of Patent: May 12, 2009

(54) LIGHT EMITTING DIODE DRIVING CIRCUIT AND OPTICAL TRANSMITTER FOR USE IN OPTICAL FIBER LINK

(75) Inventor: Takayuki Shimizu, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 914 days.

(21) Appl. No.: 11/048,883

(22) Filed: Feb. 3, 2005

(65) Prior Publication Data

US 2005/0168419 A1    Aug. 4, 2005

(30) Foreign Application Priority Data

Feb. 4, 2004    (JP) .............................. 2004-028693

(51) Int. Cl.
*H04B 10/00*    (2006.01)
(52) U.S. Cl. ........................ 398/182; 398/193; 398/197
(58) Field of Classification Search ......... 398/182–201; 372/6
See application file for complete search history.

(56) References Cited

FOREIGN PATENT DOCUMENTS

| JP | 10-242522 A | 9/1998 |
|---|---|---|
| JP | 2000-004202 A | 1/2000 |
| WO | WO-02/33858 A2 | 4/2002 |

*Primary Examiner*—Agustin Bello
(74) *Attorney, Agent, or Firm*—Birch, Stewart, Kolasch & Birch, LLP

(57) ABSTRACT

An LED driving circuit includes: (a) a current mirror circuit having N-channel MOS transistors whose respective gates are connected with each other, (b) a constant current source for supplying an LED driving current to an N-channel MOS transistor 4, (c) an LED connection terminal, connected with the N-channel MOS transistors, for connecting the LED, (d) an inverter and an input-terminal respectively for inputting, to a source of the N-channel MOS transistor, an ON/OFF signal for controlling ON/OFF of the LED, and (e) a peaking circuit, connected with a drain and source of the N-channel MOS transistor, for generating a peaking current used in peaking a current flowing into the LED. With this arrangement, it is possible to provide an LED driving circuit that easily realizes low current consumption and high-speed emission for the LED. With such an LED driving circuit, an optical transmitter for use in an optical fiber link can also be realized.

8 Claims, 11 Drawing Sheets

LIGHT EMITTING DIODE DRIVING CIRCUIT AND OPTICAL TRANSMITTER FOR USE IN OPTICAL FIBER LINK

This Nonprovisional application claims priority under 35 U.S.C. §119(a) on Patent Application No. 2004/028693 filed in Japan on Feb. 4, 2004, the entire contents of which are hereby incorporated by reference.

FIELD OF THE INVENTION

The present invention relates to an optical transmitter, for use in an optical fiber link, having a light emitting diode (hereinafter referred to as LED) serving as a light emitting element, examples of such optical transmitters including an optical transmitter for use in digital audio equipment, an optical transmitter for use in an in-vehicle optical fiber link, and an optical transmitter for use in a high-speed photocoupler. The present invention also relates to an LED driving circuit which is suitable for use in such an optical transmitter.

BACKGROUND OF THE INVENTION

An optical fiber link (a link utilizing an optical fiber) has been widely used in common house holds, particularly for music-related purposes. The optical fiber link is used for communicating optical digital signals in digital audio systems such as CD (compact disc) players, MD (mini disc) players, DVD (digital versatile disc) players, and amplifiers having a digital input terminal. In each of the above listed digital audio systems, a light receiving/emitting device for use in the optical fiber link is adopted for inputting/outputting the optical digital signals. Specifically, a light emitting device (optical transmitter) for use in the optical fiber link is used to output the optical digital signals, and a light receiving device for use in the optical fiber link is used to input the optical digital signals.

In recent years, the optical fiber link has been also widely used for communicating music signals in portable systems such as laptop computers, portable phones, and MPEG3 (Motion Picture Experts Group)-1 Audio Layer 3) players. Under these circumstances, it is required that power consumption be reduced in the light receiving/emitting device, so that batteries of these portable devices last longer.

Since the optical fiber is a signal communicating medium which is light weight and excellent in noise-resistance characteristics, the optical fiber link is also suitable for communicating signals in in-vehicle systems. Examples of currently available in-vehicle-use optical fiber links for practical applications are MOST (Media Oriented Systems Transport) and IDB (ITS Data Bus)1394. The low current consumption is required also in the light receiving/emitting device for use in the optical fiber link in a vehicle, so that the battery of the vehicle lasts longer.

Typically, the light emitting device (optical transmitter) includes an LED and an LED driving circuit for driving the LED.

Various types of LED driving circuits are known. One is a differential drive type LED driving circuit disclosed in Japanese Laid-Open Patent Publication No. 242522/1998 (Tokukaihei 10-242522; published on Sep. 11, 1998). Another is a single drive type LED driving circuit disclosed in Japanese Laid-Open Patent Publication No. 4202/2000 (Tokukai 2000-4202; published on Jan. 7, 2000). In FIGS. 10 and 11 shown are typical conventional LED driving circuits for use in the optical fiber link.

A circuit shown in FIG. 10 is a differential drive type LED driving circuit, suitable for high-speed LED driving. An input electronic signal IN (voltage Va) is inputted into an inverter INV1 having an N-channel MOS (Metal Oxide Semiconductor) transistor and a P-channel MOS transistor. An output signal from the inverter INV1 is inputted into a differential amplification circuit having (i) N-channel MOS transistors MN1 and MN2 and (ii) a constant current source for supplying a constant driving current Imod. More specifically, the output signal from the INV1 is inputted to a gate of the N-channel MOS transistor MN1. Further, the output signal from the INV1 is inverted by an inverter INV2, and is inputted to a gate of the N-channel MOS transistor MN2. An LED is connected between a drain of the N-channel MOS transistor MN2 and a power source line (power source voltage Vcc). When a voltage Vb of the output signal from the inverter INV1 is low level, and a voltage Vc of the output signal from the INV2 is high level; that is, when the input electronic signal IN is high level, the N-channel MOS transistor MN1 is turned OFF, and the N-channel MN2 is turned ON. As a result, the driving current Imod flows in the LED, causing the LED to emit light. On the contrary, When the voltage Vb of the output signal from the inverter INV1 is high level, and the voltage Vc of the output signal from the INV2 is low level (i.e. when the input electronic signal IN is low level), the N-channel MOS transistor MN1 is turned ON, and the N-channel MOS transistor MN2 is turned OFF. As a result, the driving current stops flowing in the LED, causing the LED to stop emitting light. Further, if a current Iled flowing in the LED is completely brought down to zero while the LED is not emitting light, flowing the driving current Imod in the LED do not immediately leads to emission. In short, a delayed light emission will occur. In order to reduce such a delay, a bias current Ibias is usually supplied to the LED while the LED is OFF. The bias current Ibias is supplied within a predetermined range of an extinction ratio (ON/OFF ratio in the luminous intensity of the LED). Further, in order to achieve high-speed LED driving, a peaking current Ipeak for peaking the driving current is often flown through the LED at the rise and fall of the LED driving current Imod (waveforms of the LED driving current is reshaped to have a peaking point at the rising and falling edges)(See FIG. 12). As shown in FIG. 10, the output signal (Voltage Vb) from the inverter INV1 is inverted by the inverter INV3, and by a capacitor Cp and a resistor Rp, the peaking current Ipeak is generated from the inverted signal. It should be noted that FIG. 12 shows the waveforms (time-dependent change) of (i) the voltage Va of the input electronic signal IN, (ii) the voltage Vb of the output signal from the inverter INV1, (iii) the voltage Vc of the output signal from the inverter INV2, (iv) the voltage Vd of the output signal from the inverter INV3, (v) the driving current Imod, the peaking current Ipeak, (vi) the current Iled flowing through the LED, and (vii) output light (luminous intensity).

In the differential drive type LED driving circuit shown in FIG. 10, the driving current Imod constantly flows through a differential circuit (N-channel MOS transistors MN1 and MN2). This causes a difficulty in reducing current consumption. Further, due to a delay in an inverter INV3, the peaking current lags behind the driving current. This causes the driving current and the peaking current to rise at different timings. Since the shift in rising timing causes the peak of the current flowing in the LED to appear some time after the rise of the current, the rising time and falling time becomes longer. This may cause distortion in a pulse width, which, in turn, may cause difficulties in accelerating the response speed of the LED emitting light.

A circuit shown in FIG. 11 is a conventional example of the single drive type LED driving circuit. An input signal IN is inputted to an inverter INV1, inverted by the inverter INV2, and then inputted to a gate of an N-channel MOS transistor MN3. A current from a constant current source Io is inputted to a current mirror circuit having an N-channel MOS transistor MN1 and an N-channel MOS transistor MN2. In the case where the N-channel MOS transistors MN1 and MN2 have the same gate length, a current flowing through the N-channel MOS transistors MN1 and a current flowing in the N-channel MOS transistor MN2 are proportional to the gate widths of the respective N-channel MOS transistors MN1 and MN2. Usually, the current Io is set to 1/N (where N is usually 2 or more) of the driving current Imod, so that the current flowing into the drain of the N-channel MOS transistor MN2 becomes the driving current Imod when N is the gate width ratio of the N-channel MOS transistor MN2 to the N-channel MOS transistor MN1 (i.e. gate width of MN2/gate width of MN1). The drain of the N-channel MOS transistor MN2 is connected with a source of the N-channel MOS transistor MN3, and an LED is connected between the drain of the MN3 and a power source terminal Vcc. When the gate of the N-channel MOS transistor MN3 is at high level, the N-channel MOS transistor MN3 is turned ON. As a result, the driving current Imod flows into the LED, causing the LED to emit light. On the contrary, when the gate of the N-channel MOS transistor MN3 is at low level, the N-channel MOS transistor MN3 is turned OFF, thereby causing the LED to stop emitting light. Here, while the N-channel MOS transistor MN3 is turned OFF, the current does not flow into the N-channel MOS transistor MN2. Accordingly, unlike the differential driving type shown in FIG. 10, there will be no constant flow of the driving current Imod. This allows for reduction of current consumption.

However, in the single driving type LED driving circuit shown in FIG. 11, the peaking current is determined based on a size of the N-channel MOS transistor MN3 for use in switching. This causes difficulties in controlling a peaking amount (height of a rising peak), which, in turn, may cause difficulties in accelerating the response speed of the LED emitting light.

As described, the differential drive type LED driving circuit shown in FIG. 10 is suitable for high speed driving; however, a constant flow of the driving current in the differential circuit causes difficulties in reducing current consumption. Further, it is difficult to match the ON/OFF timing of the driving current with the ON/OFF timing of the peaking current. Therefore, it is difficult to accelerate the response speed of the LED emitting light.

On the other hand, the single drive type LED driving circuit shown in FIG. 11 is advantageous in reducing current consumption, because the driving current does not flow while the LED is turned OFF; however, it is difficult to freely control the peaking amount, because the peaking current value is determined based on the size of the MOS transistor for use in switching, i.e. the N-channel MOS transistor MN3. Further, as shown in FIG. 13, the driving current is peaked while the LED is ON, but the driving current is not peaked while the LED is OFF. This extends the falling time of light from the LED. Thus, it is difficult to accelerate the response speed of the LED emitting light.

SUMMARY OF THE INVENTION

In view of the foregoing problems, the present invention was made, and an object of the present invention is to provide a light emitting diode driving circuit that easily realizes low current consumption and high-speed light emission for the LED, and to provide an optical transmitter for use in an optical fiber link adopting such a light emitting diode driving circuit.

In order to achieve the foregoing object, a light emitting diode driving circuit of the present invention includes (a) a current mirror circuit having a first MOS transistor and a second MOS transistor whose respective gates are connected with each other; (b) a current supplying section for supplying, to the first MOS transistor, a current for driving a light emitting diode; (c) a light emitting diode connection terminal, connected with the second MOS transistor, for connecting the light emitting diode; (d) an ON/OFF signal input section for inputting, to a source of the second MOS transistor, an ON/OFF signal for controlling ON/OFF of the light emitting diode; and (e) a peaking circuit, connected with a drain and a source of the second MOS transistor, for generating a peaking current used in peaking a current flowing through the light emitting diode. Further, in order to achieve the foregoing object, a light emitting diode driving circuit of the present invention includes (a) a current mirror circuit having a first bipolar transistor and a second bipolar transistor whose respective bases are connected with each other; (b) a current supplying section for supplying, to the first bipolar transistor, a driving current for driving a light emitting diode; (c) a light emitting diode connection terminal, connected with the second bipolar transistor, for connecting the light emitting diode; (d) an ON/OFF signal input section for inputting, to an emitter of the second bipolar transistor, an ON/OFF signal for controlling ON/OFF of the light emitting diode; and (e) a peaking circuit, connected with a collector and the emitter of the second bipolar transistor, for generating a peaking current used in peaking a current flowing through the light emitting diode.

In the foregoing configuration, in the case where the ON/OFF signal is at a voltage level (e.g. ground electrical potential) that causes the light emitting diode to emit light, a drive current supplied to the first MOS or bipolar transistor is mirrored at a predetermined ratio, and flows into the light emitting diode and the second MOS or bipolar transistor. At the same time, a peaking current is supplied from the peaking circuit to the light emitting diode. That is, the current that flows into the LED is produced by overlapping the peaking current with the current that flows into the second MOS or bipolar transistor, and therefore the current so produced is peaked (current with a waveform whose rising and falling edges have a peak point). This allows the LED to be turned ON or OFF at high speed.

Further, the ON/OFF signal simultaneously causes (i) switching in the current mirror circuit for supplying the driving current to the light emitting diode and (switching whether to supply the driving current to the LED from the second MOS or bipolar transistor), and (ii) switching in the peaking circuit for generating the peaking current (switching whether to supply the peaking current to the LED). Thus, it is possible to match the rising timing and falling timing of the driving current with the rising timing and falling timing of the peaking current, respectively. As a result, a waveform of the current flowing into the light emitting diode is accurately peaked, thereby easily increasing the response speed of the LED emitting light.

Further, with the foregoing configuration, it is possible to freely adjust the value of the peaking current by suitably setting the characteristics of elements constituting the peaking circuit. For example, in the case where the peaking circuit has a capacitor and a resistor being serially connected with each other, the value of the peaking current can be freely adjusted by suitably setting the capacitance of the capacitor and the resistance of the resistor. This allows an optimum peaking amount to be set for different combinations of the LED and the LED driving circuit. Thus, the response speed of the LED emitting light is easily increased.

Further, in the foregoing configuration, since switching of the driving current from the drive current source is carried out by the current mirror circuit, the driving current does not flow into the current mirror circuit while the light emitting diode is OFF. This allows for reduction of current consumption.

Further, since switching of the driving current from the drive current source is carried out by the current mirror circuit, it is possible to accurately regulate a current value of the driving current, and to reduce fluctuations in the current value of the driving current.

Additional objects, features, and strengths of the present invention will be made clear by the description below. Further, the advantages of the present invention will be evident from the following explanation in reference to the drawings.

DESCRIPTION OF THE EMBODIMENTS

Embodiment 1

Figure 1:
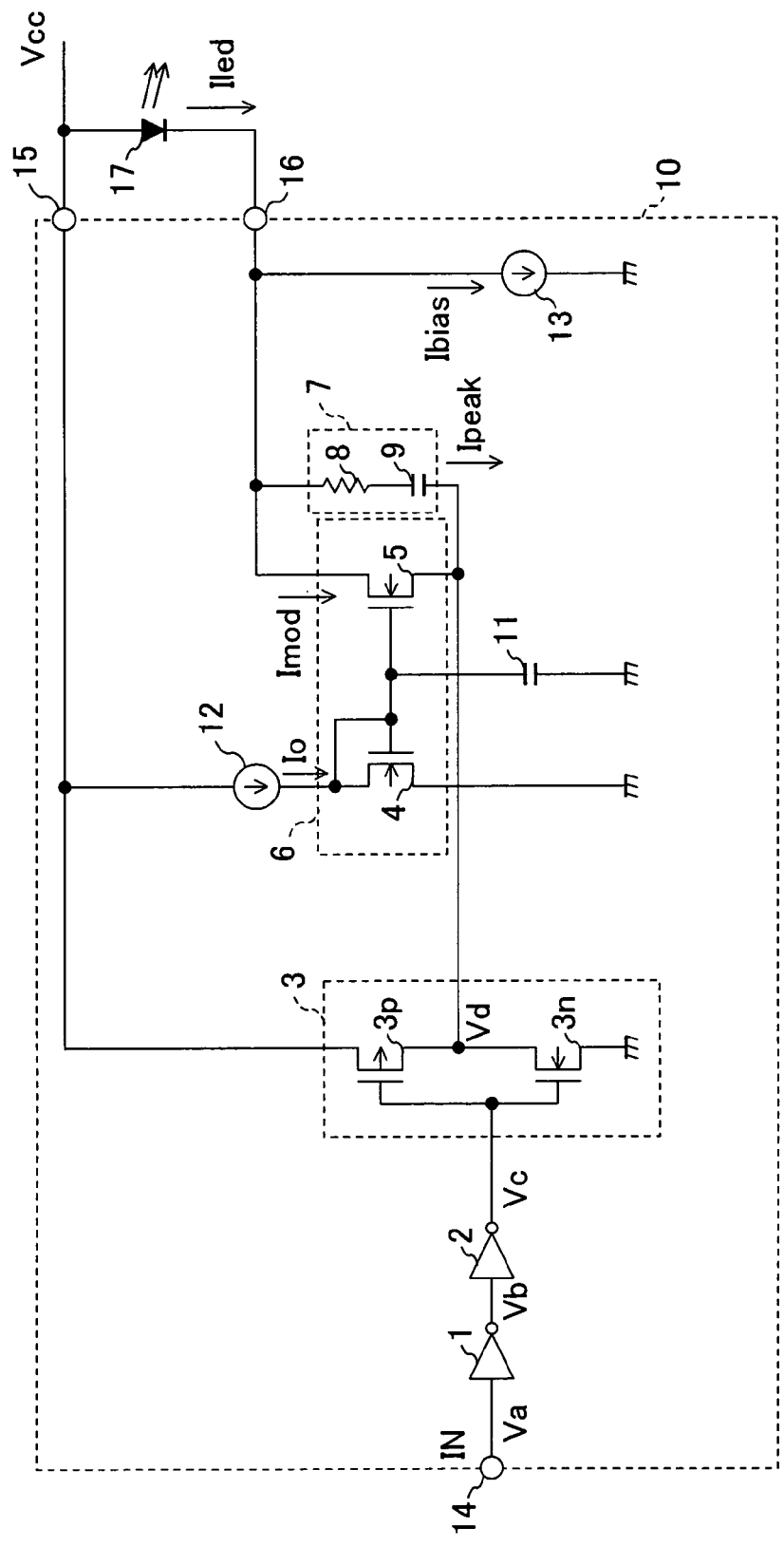
FIG. 1 is a circuit diagram illustrating a configuration of an optical transmitter for use in an optical fiber link according to a first embodiment of the present invention.

The following is a detailed description of an embodiment in accordance with the present invention with reference to the drawings. FIG. 1 shows an embodiment of the present invention, and is a block diagram showing a configuration of an optical transmitter for use in the optical fiber link.

The optical transmitter for use in the optical fiber link of the present invention is provided with an LED (light emitting diode) 17 and an LED driving circuit 10 for driving the LED 17. The LED driving circuit 10 is provided with an input terminal (IN) 14 to which an input electronic signal IN is inputted, a power source terminal (VCC) 15 connected with a constant voltage source (not shown) for outputting a power source voltage Vcc, and an LED connection terminal (LED OUT) 16 to which the LED 17 is connected. One end of the LED 17 is connected with the power source terminal 15, and the other end of the LED 17 is connected with the LED connection terminal 16.

The input electronic signal IN is inputted to the input terminal 14. A voltage (Va) of the input electronic signal IN is high level while the LED 17 is ON, and is low level while the LED 17 is OFF. The input electronic signal IN inputted to the input terminal 14 is inputted to an inverter (INV)1 having an N-channel MOS transistor (not shown) and a P-channel MOS transistor (not shown). The inverter 1 is connected with an inverter 2, and the inverter 2 is connected with an inverter 3. The inverter 2 also includes an N-channel MOS transistor (not shown) and a P-channel MOS transistor (not shown), and the inverter 3 includes an N-channel MOS transistor $3n$ and a P-channel MOS transistor $3p$. A gate of the N-channel MOS transistor $3n$ and a gate of the P-channel MOS transistor $3p$ are connected with the input terminal (output terminal of the inverter 2). A source of the N-channel MOS transistor $3n$ is grounded, and a drain of the N-channel MOS transistor $3n$ is connected with a source of the P-channel MOS transistor $3p$. A drain of the P-channel MOS transistor $3p$ is connected with the constant voltage source (not shown) via the power source terminal 15.

A signal (on/off signal) inputted to a source of an N-channel MOS transistor 5 is produced by inverting the input electronic signal IN through the inverter 1, the inverter 2, and the inverter 3. In this case, an ON/OFF signal input section for inputting the on/off signal to the N-channel MOS transistor 5 includes the input terminal 14 and the serially-connected inverters 1 through 3. Further, the inverter 3 inverts an inverted ON/OFF signal (an inverted signal of the ON/OFF signal) from an inverted on/off signal supplying section, so as to generate the on/off signal to be inputted to the source of the N-channel MOS transistor 5. The inverted on/off signal supplying section includes the input terminal 14 and the inverters 1 and 2. In this case, the voltage of the on/off signal to be inputted to the source of the N-channel MOS transistor 5 is low level while the LED 17 is ON, and is high level while the LED 17 is OFF.

Here, the sizes of the N-channel MOS transistors and the P-channel MOS transistors constituting the inverters 1 through 3 increase from the inverter 1 to the inverter 3 in this order, i.e. a transistor size of the inverter 1<the transistor size of the inverter 2<the transistor size of the inverter 3. In this way, the on-resistances in the respective MOS transistors constituting the inverters 1 through 3 are gradually made smaller, thereby increasing driving capability.

The LED driving circuit 10 is provided with a current mirror circuit 6 having an N-channel MOS transistor (MN) 4

(first MOS transistor) and an N-channel MOS transistor 5 (second MOS transistor). A gate of the N-channel MOS transistor 4 and a gate of the N-channel MOS transistor 5 are connected with each other, and are respectively connected with a drain of the N-channel MOS transistor 4. Further, a source of the N-channel MOS transistor 4 is grounded. The drain of the N-channel MOS transistor 5 is connected with the LED connection terminal (LED OUT) 16.

A constant current source 12 serving as a driving current source for supplying a driving current Imod for driving the LED 17 is connected with the constant voltage source (not shown) via the power source terminal 15. From the constant current source 12, a constant current with current value Io is supplied. The constant current source 12 is connected with the current mirror circuit 6. More specifically, the constant current source 12 is connected with the drain and the gate of the N-channel MOS transistor 4, and the gate of N-channel MOS transistor 5. Here, a gate area of the N-channel MOS transistor 5 is set N times greater than a gate area of the N-channel MOS transistor 4, so that a drain current of the N-channel MOS transistor 5 is N times a drain current of the N-channel MOS transistor 4 when a source voltage of the N-channel MOS transistor 5 is GND (0). For example, in a case where a gate length of the N-channel MOS transistor 4 and a gate length of the N-channel MOS transistor 5 are the same, a ratio of a gate width WMN1 of the N-channel MOS transistor 4 to a gate width WMN2 of the N-channel MOS transistor 5 is set:

WMN1:WMN2=1:N, so that the drain current of the N-channel MOS transistor 5 is N times the drain current of the N-channel MOS transistor 4 when the source voltage of the N-channel MOS transistor 5 is GND (0). A value of N is preferably within a range between 2 to 100, and more preferably within a range of 10 to 1000. This allows for reduction of power consumption by restraining the power dissipation of the constant current source 12, and confines an error of the driving current with respect to a reference current within a suitable range for practical applications.

It should be noted that a capacitor 11 is connected with the gate of the N-channel MOS transistor 4 and with the gate of the N-channel MOS transistor 5 in the current mirror circuit 6. This capacitor 11 is for stabilizing a current-mirror current, and one end of the capacitor 11 is grounded.

An output terminal of the inverter 3 is connected with the source of the N-channel MOS transistor 5. When an input voltage Vc is high level, an output voltage Vd from the inverter 3 is low level, and the source voltage in the N-channel MOS transistor 5 becomes GND level (O). As such, the constant current Io supplied from the constant current source to the N-channel MOS transistor 4 is mirrored in accordance with a gate area ratio of the N-channel MOS transistor 4 and the N-channel MOS transistor 5, so as to generate the driving current Imod to be supplied to the N-channel MOS transistor 5. In short, the current value of the driving current Imod to flow in the N-channel MOS transistor 5 is: Imod=N×Io.

On the other hand, when the input voltage Vc of the inverter 3 is low level, the output voltage Vd of the inverter 3 is high level, and therefore a gate-source voltage (=gate potential−source potential) Vgs across the gate and source of the N-channel MOS transistor 5 will have a negative value. As a result the current stops flowing in the drain and the source of the N-channel MOS transistor 5.

Further, the output terminal of the inverter 3 is connected with a peaking circuit 7. The peaking circuit generates a peaking current Ipeak for peaking the driving current Imod. In other words, the peaking current Ipeak shapes a waveform of the driving current Imod so that a rising edge and a falling edge have peak points. In addition to the driving current Imod whose waveform is the same as that of the input electronic signal IN (e.g. rectangular wave), the peaking current Ipeak also flows into the LED 17, As a result, the waveform of the current Iled flowing into the LED 17 will have a peak point at the respective rising edges and falling edges of the waveform. The peaking circuit 7 includes a capacitor 9 and a resistor 8 serially connected with each other between the output terminal of the inverter 3 and the LED connection terminal 16.

It should be noted that the modulated current Imod and the peaking current Ipeak are both driven by the output signal (i.e. on/off signal) from the inverter 3, and therefore a rising timing and a falling timing of the driving current (modulated current) Imod can accurately match the rising timing and the falling timing of the peaking current Ipeak, respectively. In other words, in the present embodiment, it is possible to match the rising timing and the falling timing of the driving current Imod with the rising timing and the falling timing of the peaking current Ipeak (i) by switching the current mirror circuit 6, having the N-channel MOS transistors 4 and 5, with its base grounded, and (ii) simultaneously by switching the peaking- circuit 7 for generating the peaking current Ipeak, by using the N-channel MOS transistor 3n and P-channel MOS transistor 3p provided for the switching of the driving current Imod. Therefore, the rising edge of the current flowing into the LED is accurately peaked. This allows for high-speed driving of the LED 17.

Further, if the forward current flowing into the LED 17 is brought down to zero while the LED 17 is turned OFF, the driving current (the modulated current Imod and the peaking current Ipeak) cannot immediately turn ON the LED 17 when it is flown into the LED 17. In short, there is an emission delay. Such a delay can be reduced by supplying a bias current Ibias to the LED 17 while the LED 17 is being turned OFF. This is carried out within a range of an extinction ratio (ON/OFF ratio of light intensity of the LED 17) afforded by the specifications of the application. This restrains distortion of a pulse width. The bias current Ibias can be supplied to the LED 17 by connecting a bias current source 13, with its one end is grounded, with the LED connection terminal 16.

Figure 3:
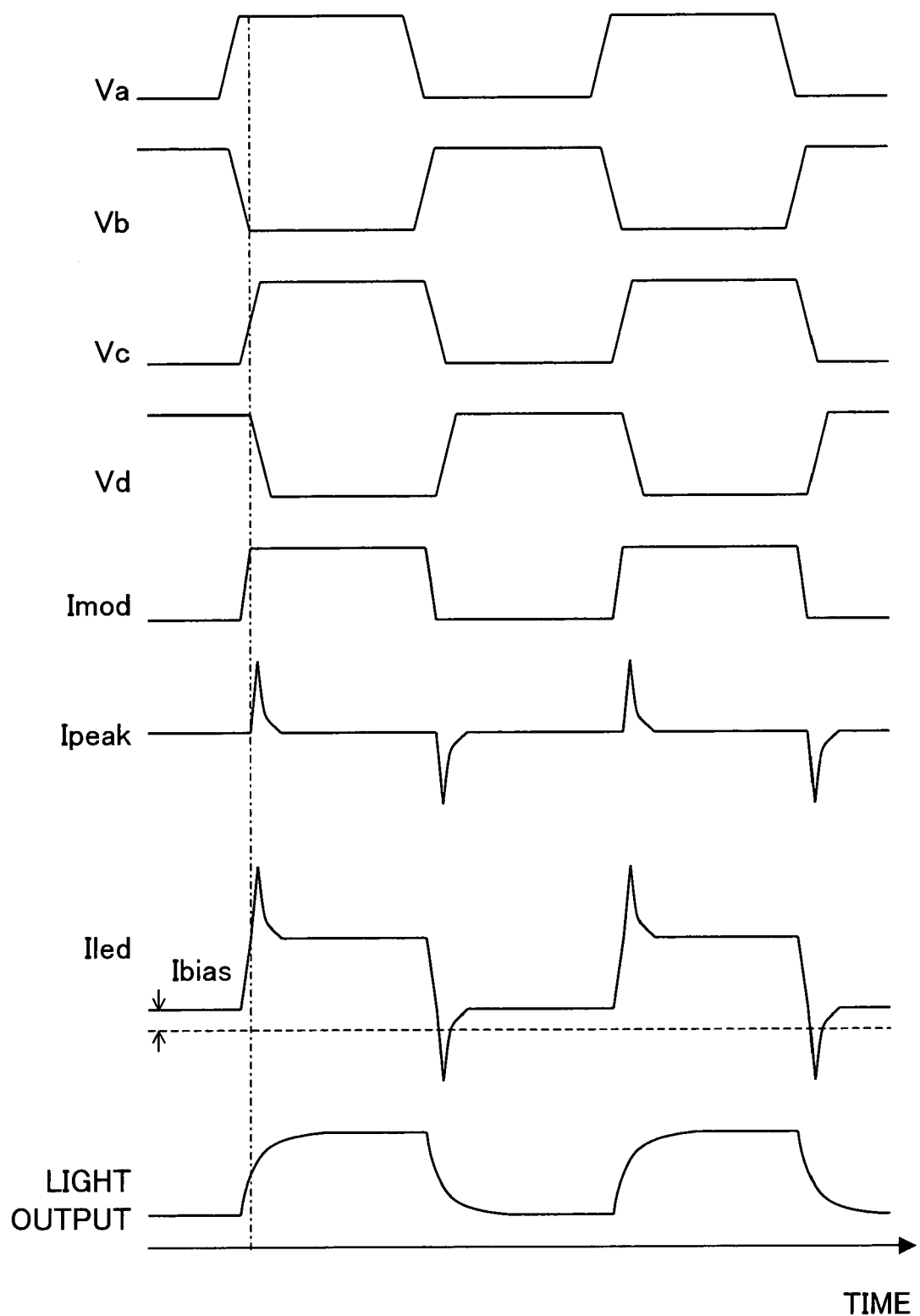
FIG. 3 is a waveform chart illustrating voltage and current waveforms at different points in time, when a rectangular wave signal is inputted in the optical transmitter for an optical fiber link according to the first and second embodiments of the present invention.

FIG. 3 shows waveforms of current and voltage at different points in the optical transmitter for use in the optical fiber link, in the case where a rectangular wave signal is inputted, as the input electronic signal IN, to the input terminal 14. More specifically, FIG. 3 shows waveforms (time-dependent change) of the voltage Va of the input electronic signal IN, the voltage Vb of the output signal from the inverter 1, the voltage Vc of the output signal from the inverter INV2, the voltage Vd of the output signal from the inverter 3, the driving current Imod, the peaking current Ipeak, the current flowing in the LED Iled, and output light (i.e. luminous intensity). It can be seen from FIG. 3 that the rising timing and the falling timing of the modulated current Imod, and the rising timing and the falling timing of the peaking current Ipeak are accurately matched with each other.

Embodiment 2

Another embodiment of the present invention is described below with reference to FIG. 2. Note that the same reference numerals and symbols are given to the members that have the same functions as those described in the foregoing embodiment 1, and descriptions of those members are omitted here as a matter of convenience.

Figure 2:
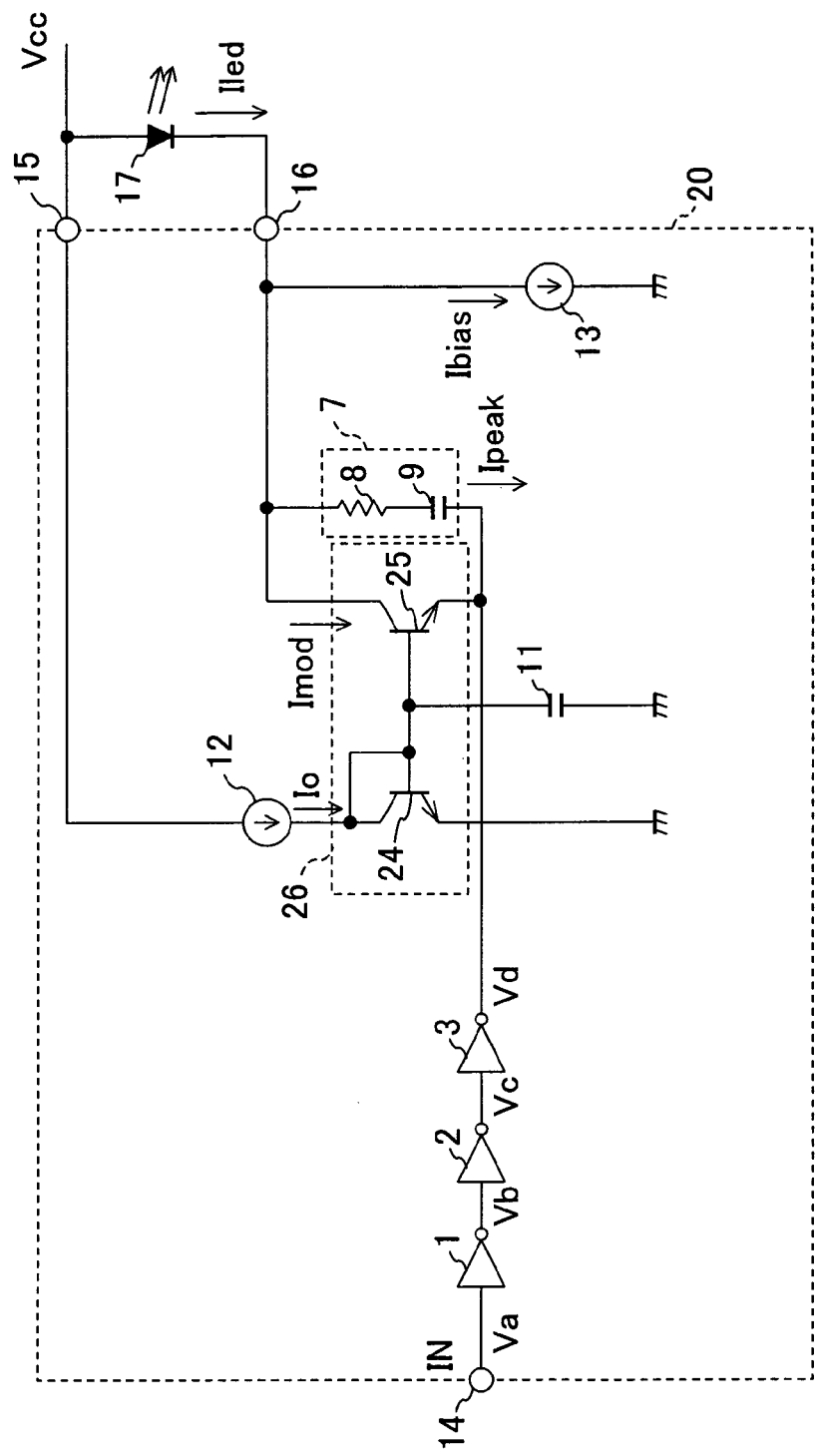
FIG. 2 is a circuit diagram illustrating a configuration of an optical transmitter for use in an optical fiber link according to a second embodiment of the present invention.

As shown in FIG. 2, a configuration of an LED driving circuit 20 of the present embodiment is the same as the configuration of the LED driving circuit 10 of the foregoing embodiment 1, except in that the current mirror circuit 6 having the N-channel MOS transistor 4 and the N-channel MOS transistor 5 is replaced with a current mirror circuit 26 having a bipolar NPN transistor (QN) 24 serving as a first bipolar transistor, and a bipolar NPN transistor 25 serving as a second bipolar transistor.

In this case, a base and a collector of the bipolar NPN transistor 24 are connected with a base of the bipolar NPN transistor 25. Further, an emitter of the bipolar NPN transistor 24 is grounded. A peaking circuit 7 is connected between a collector and an emitter of the bipolar NPN transistor 25. The emitter of the bipolar NPN transistor 25 is connected with the output terminal of an inverter 3, and an LED connection terminal 16 is connected with the collector of the bipolar NPN transistor 25.

When the input electronic signal IN of a rectangular wave signal is inputted to the input terminal 14, waveforms of current and voltage at respective points of an optical transmitter for use in the optical fiber link of the present embodiment are the same as those in the foregoing embodiment 1 as shown in FIG. 3.

Embodiment 3

Figure 4:
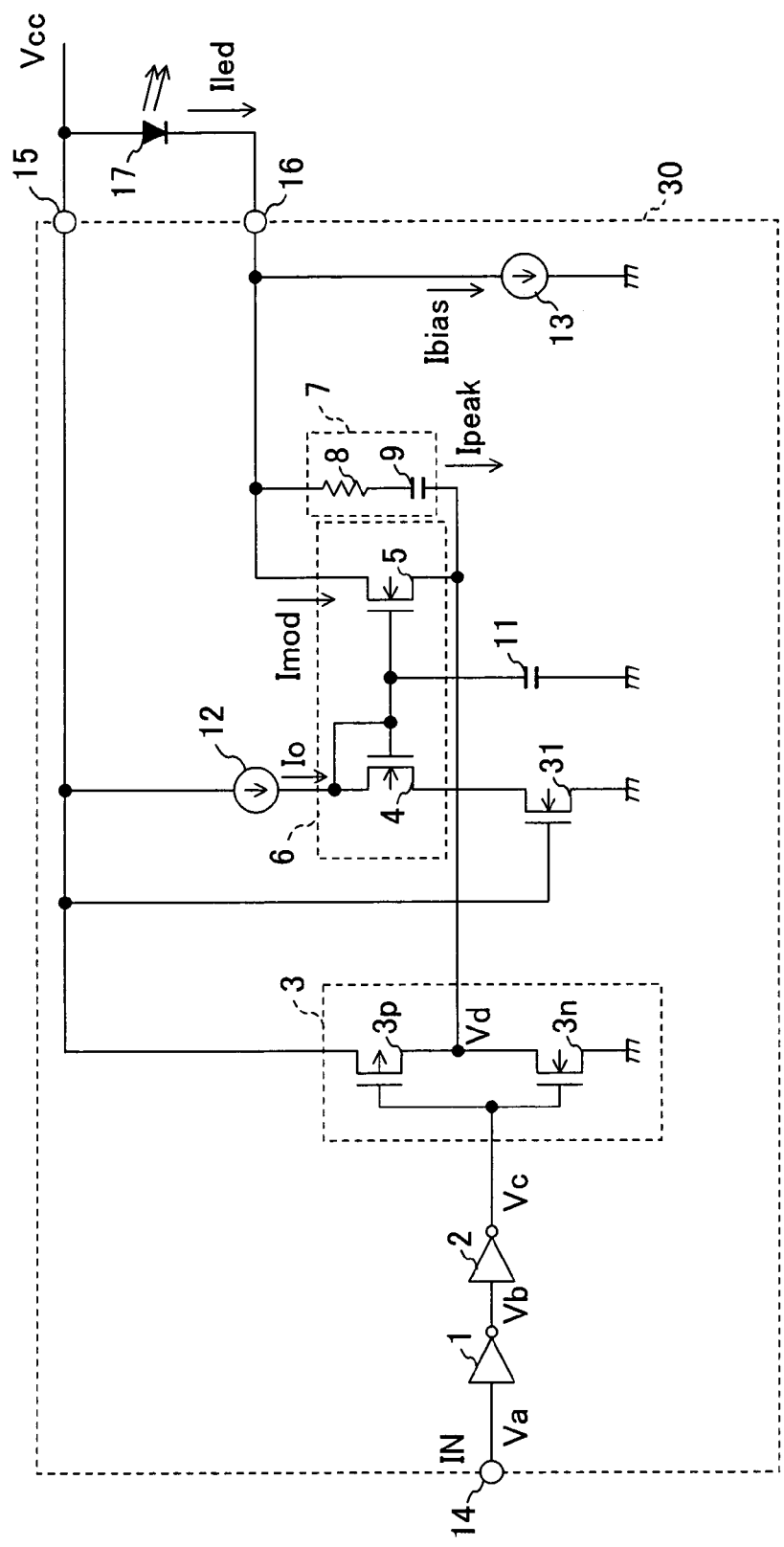
FIG. 4 is a circuit diagram illustrating a configuration of an optical transmitter for use in an optical fiber link according to a third embodiment of the present invention.

Still another embodiment of the present invention is described below with reference to FIG. 4. Note that the same reference numerals and symbols are given to the members that have the same functions as those described in the foregoing embodiment 1, and descriptions of those members are omitted here as a matter of convenience.

In the LED driving circuit 10 of the foregoing embodiment 1, a current Imod flows into the output terminal of the inverter 3, when an output voltage Vd from the inverter 3 is low level. More specifically, when the output voltage Vd from the inverter 3 is low level, the N-channel MOS transistor $3n$ in the inverter 3 is turned on, and therefore the Imod flows between the drain and source of the N-channel MOS transistor $3n$. The output voltage does not become GND level (0) completely, due to an on-resistance of the N-channel MOS transistor $3n$. When Ron($3n$) is the on-resistance of the N-channel MOS transistor $3n$, the output voltage from the inverter 3 (a voltage at the drain of the N-channel MOS transistor $3n$) is Ron($3n$)×Imod. This is equivalent to a case where a resistance is added to the source of the N-channel MOS transistor 5. Therefore the modulated current Imod (the current between the drain and source of the N-channel MOS transistor 5) deviates from a designed value (optimum value) of N×Io. Further, in a case where the on-resistance of the N-channel MOS transistor $3n$ is dependent on temperature, the amount the modulated current Imod deviating from the designed value N×Io increases as the temperature increases.

In order to prevent deviation of the modulated current Imod, an LED driving circuit 30 of the present embodiment additionally has an N-channel MOS transistor (a third MOS transistor) 31 in the configuration of the LED driving circuit 10 of the foregoing embodiment 1. A gate length of the N-channel MOS transistor 31 is the same as that of the N-channel MOS transistor $3n$, and a gate width of the N-channel MOS transistor 31 is 1/N of the gate width of the N-channel MOS transistor $3n$. The N-channel MOS transistor 31 is interposed between the N-channel MOS transistor 4 and ground. In short, the drain of the N-channel MOS transistor 31 is connected with the source of the N-channel MOS transistor 4, and the source of the N-channel MOS transistor 31 is grounded. Further, the gate of the N-channel MOS transistor 31 is connected with a constant voltage source (not shown) via a power source terminal 15.

With the foregoing arrangement, the on-resistance of the N-channel MOS transistor $3n$ causes the modulated current Io to deviate substantially by ΔI/N, where ΔI is the amount of the modulated current Imod deviating from the designed value (optimum value) N×Io due to the on-resistance of the N-channel MOS transistor $3n$. Thus, the deviation of the modulated current Imod from the designed value (optimum value) N×Io, due to the on-resistance of the N-channel MOS transistor $3n$, is compensated (cancelled) by the on-resistance of the N-channel MOS transistor 31. As a result, the driving current Imod satisfies the relation:

$$Imod = N \times Io,$$

over a wider temperature range.

Usually, light emitting efficiency of the LED 17 decreases as the temperature increases. Therefore, in order to obtain constant light emission within an operating temperature range, the reference current Io should have such temperature characteristics that the driving current Imod increases with increase in temperature. For example, this is achieved by using a current source that produces a reference current Io which increases with increase in temperature.

It should be noted that, in the LED driving circuit 30 of the present embodiment, a current mirror circuit 6 having the N-channel MOS transistor 4 and an N-channel MOS transistor 5 may be replaced with a current mirror circuit 26 having a bipolar NPN transistor (QN) 24 and a bipolar NPN transistor 25.

Embodiment 4

Yet another embodiment of the present invention is described below with reference to FIG. 5. Note that the same reference numerals and symbols are given to the members that have the same functions as those described in the foregoing embodiment 1 or 3, and descriptions of those members are omitted here as a matter of convenience.

Figure 5:
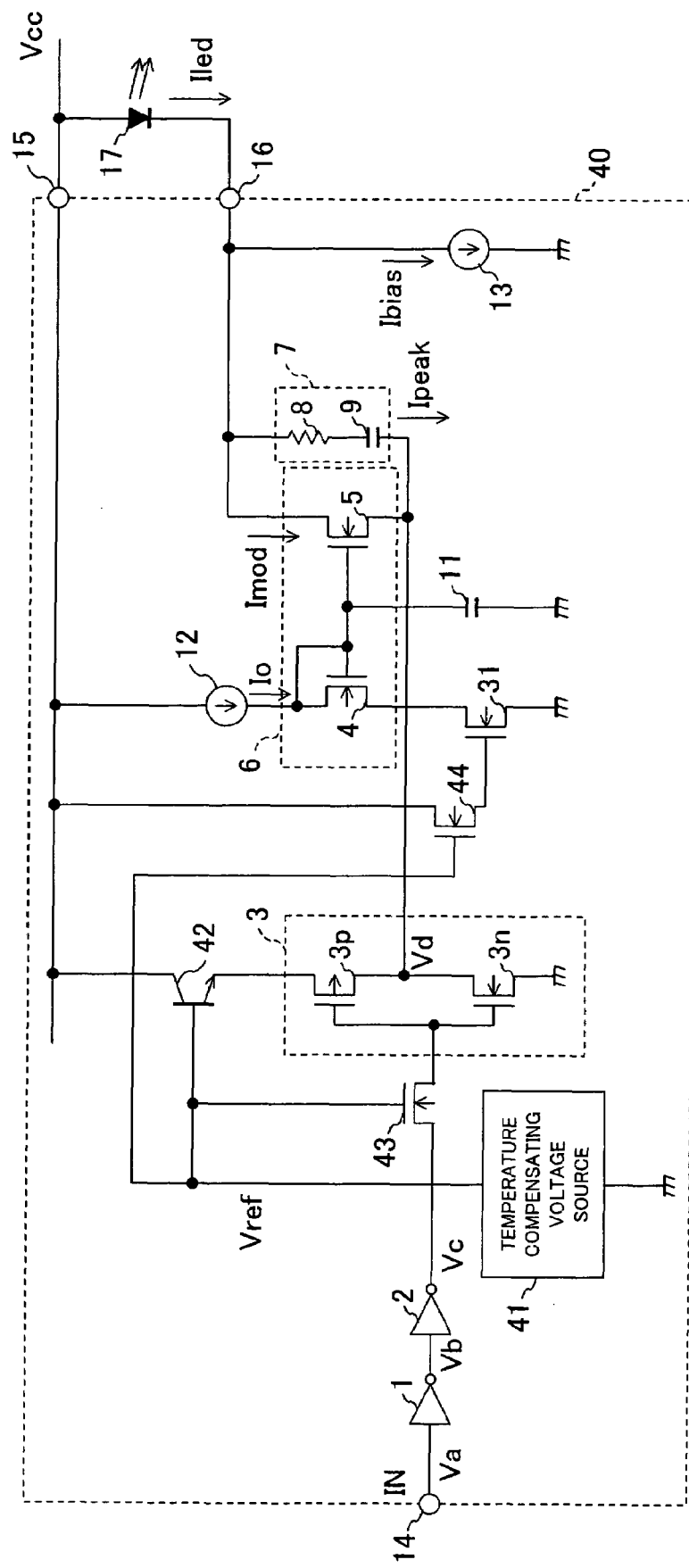
FIG. 5 is a circuit diagram illustrating a configuration of an optical transmitter for use in an optical fiber link according to a fourth embodiment of the present invention.

FIG. 5 is a block diagram illustrating a configuration of an LED driving circuit 40 and an optical transmitter for use in an optical fiber link, according to the present embodiment. The LED driving circuit 40 and the optical transmitter of the present embodiment are the same as those of the foregoing embodiment 3, except that the LED driving circuit 40 and the optical transmitter of the present embodiment further include, as output voltage controlling means, a temperature compensating voltage source (a voltage source with a function to compensate temperature) 41, a bipolar NPN transistor (a second adjusting transistor) 42, an N-channel MOS transistor (a first adjusting transistor) 43, and an N-channel MOS transistor 44. The temperature compensating voltage source 41 is for increasing an amplitude of an output voltage from the inverter 3.

Temperature characteristics of the driving current Imod are realized by a current source 12 (Io) having positive temperature characteristics. The N-channel MOS transistor 43 is for regulating an amplitude of an input voltage to the inverter 3. That is to say, the N-channel MOS transistor 43 is for converting an amplitude level of the input voltage to the inverter 3. The N-channel MOS transistor 43, working in pair with the N-channel MOS transistor 44, produces the same gate voltage for the NMOS $3n$ and an NMOS 31 during the light emission. More specifically, the N-channel MOS transistor 43 is provided to produce the same value for (i) an on-resistance ratio of the N-channel MOS transistor 3n and the N-channel MOS transistor 31 and (ii) a gate width ratio of the N-channel MOS transistor 5 and the N-channel MOS transistor 4.

Figure 7:
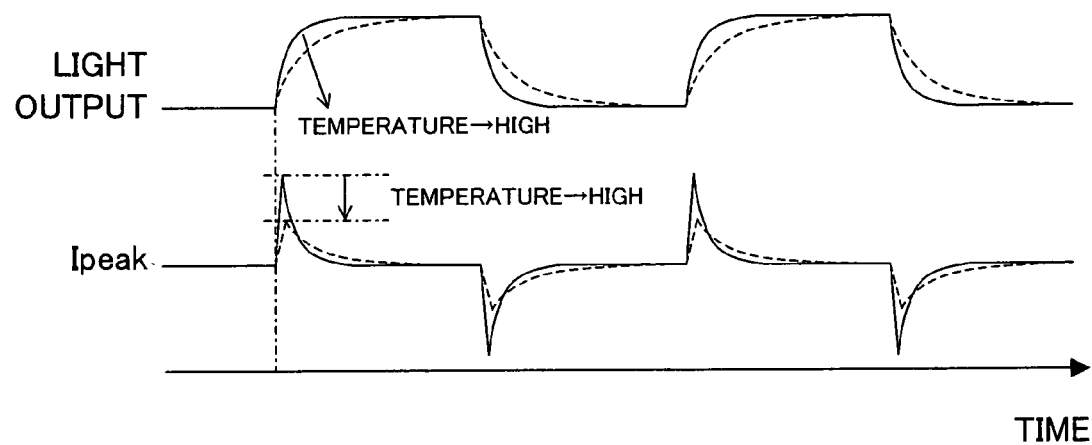
FIG. 7 is a waveform chart indicating waveforms of peaking current and light output in the optical transmitter for use in an optical fiber link according to the third embodiment of the present invention.

As shown in FIG. 7, in the LED driving circuit 30 of the foregoing embodiment 3, the on-resistance of an output section of the inverter 3 (on-resistance of the N-channel MOS transistor 3n and the P-channel MOS transistor 3p) increases when the temperature increases, thereby causing a delay in the rise and fall of an output voltage Vd from the inverter 3. This reduces a peak value of the peaking current Ipeak, thus decreasing a peak value of the current Iled flowing into the LED 17. As a result, the rise and fall of the light output (luminous intensity of the LED 17) tend to delay at high temperatures.

In order to prevent a delay in the rise and fall of the output light at high temperatures, the LED driving circuit 40 of the present embodiment functions to carry out temperature compensation for the peaking current by correcting the rise and fall of the output voltage Vd from the inverter 3. More specifically, as shown in FIG. 5, in the LED driving circuit 40 of the present embodiment, a power source voltage for the inverter 3 is supplied from the temperature compensating voltage source 41 which outputs a voltage Vref that increases with increase in temperature. The power source voltage from the temperature compensating voltage source 41 reaches a drain of the P-channel MOS transistor 3p of the inverter 3 via a base and an emitter of the bipolar NPN transistor 42. The base of the bipolar NPN transistor 42 is connected with the temperature compensating voltage source 41, and the emitter of the bipolar NPN transistor 42 is connected with the drain of the P-channel MOS transistor 3p. A collector of the bipolar NPN transistor 42 is connected with a constant voltage source (not shown) via a power source terminal 15. Note that the temperature compensating voltage source 41 is described in detail in Embodiment 6.

Further, an output (output voltage Vc) from the inverter 2 is inputted to the inverter 3, via a drain and source of the N-channel MOS transistor 43 whose gate is connected with the temperature compensating voltage source (Vref) 41. An amplitude of the output voltage Vc from the inverter 2 becomes substantially the same as that of the power source voltage. By inputting the output voltage Vc from the inverter 2 to the inverter 3 via the drain and the source of the N-channel MOS transistor 43, the amplitude of the voltage inputted to the inverter 3 becomes:

$Vref-Vgs$, where Vgs is the voltage between the gate and source of the N-channel MOS transistor 43. Further, the output voltage Vd from the inverter 3 becomes:

$Vref-Vbe$, where Vbe is the voltage between the base and emitter of the bipolar NPN transistor 42. The gate-source voltage Vgs of the N-channel MOS transistor 43 is typically about 0.5 V to 0.8 V, and the base-emitter voltage Vbe of the bipolar NPN transistor 42 is about 0.6 V to 0.8V. Thus, the amplitude of the output voltage Vc from the inverter 2 is confined within. (Vref−Vgs), when being inputted to the inverter 3. Further, the amplitude of the output voltage Vd from the inverter 3 also becomes close to a value of Vref−Vbe. Since Vref−Vbe has such positive temperature characteristics that the value of the Vref−Vbe increases with increase in temperature, it is possible to realize a circuit in which the amplitude of the output voltage Vd from the inverter 3 increases with increase in temperature. Thus, it is possible to prevent a peak value of the peaking current Ipeak from dropping at high temperatures. Here, the positive temperature characteristics of Vref−Vbe is the result of the positive temperature coefficient (increasing with temperature increase) of the output voltage Vref from the temperature compensating voltage source (Vref) 41.

Further, a gate voltage of the N-channel MOS transistor 31 is received by a source of the N-channel MOS transistor 44. More specifically, the source of the N-channel MOS transistor 44 is connected with a gate of the N-channel MOS transistor 31. A gate of the N-channel MOS transistor 44 is connected with the temperature compensating voltage source (Vref) 41, and a drain of the N-channel MOS transistor 44 is connected with the constant voltage source (not shown) via the power source terminal 15.

Further, in the LED driving circuit 40 of the present embodiment, in order to provide the same on-resistance ratio for the N-channel MOS transistor 3n and the N-channel MOS transistor 31 (assuming that the N-channel MOS transistor 3n and the N-channel MOS transistor 31 have the same gate length), (i) the on-resistance ratio of the N-channel MOS transistors 3n and 31, and that of the N-channel MOS transistors 5 and 4 are matched to give equivalent characteristics to the N-channel MOS transistors 43 and 44. This allows a drain-source voltage of the N-channel MOS transistor 3n to be substantially equal to a drain-source voltage of the N-channel MOS transistor 31, while the LED 17 is ON. Thus, the driving current Imod can satisfy the following relation in a wide temperature range.

$Imod = N \times Io$

Accordingly, the LED 17 can emit a constant quantity of light across a wide temperature range, by setting the reference current Io in such a manner as to cancel the temperature coefficient of the quantity of light emitted by the LED 17.

Figure 8:
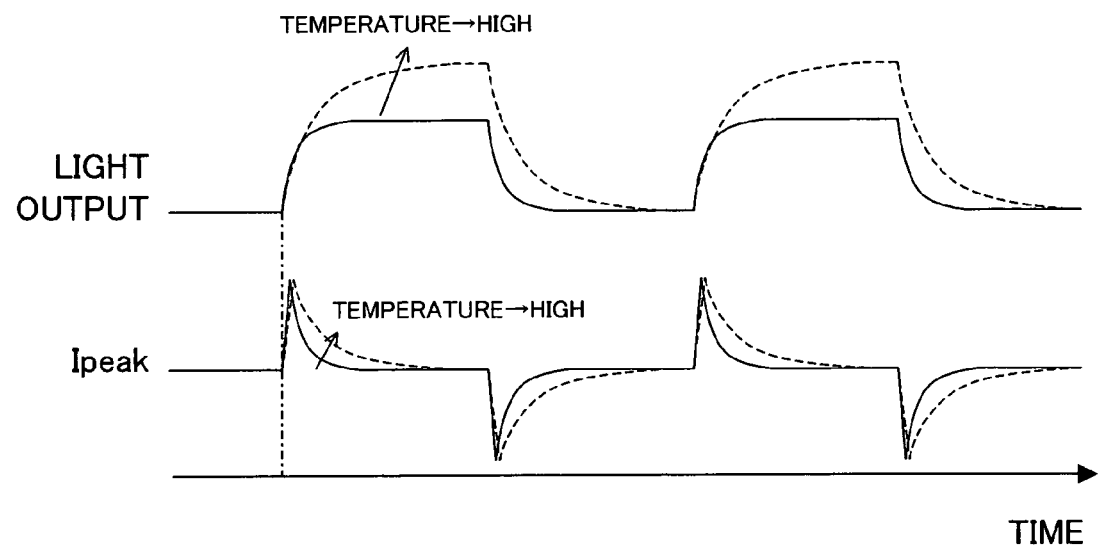
FIG. 8 is a waveform chart indicating waveforms of peaking current and light output from the optical transmitter for use in an optical fiber link according to the fourth embodiment of the present invention.

Since the LED driving circuit 40 of the present embodiment functions to carry out the temperature compensation for the peaking current Ipeak, the peak value of the peaking current Ipeak does not decrease even under high temperatures. This prevents a delay in the rising and/or falling of the light output (luminous intensity of the LED 17) (See FIG. 8).

It should be noted that the LED driving circuit 40 of the present embodiment may be provided with a current mirror circuit 26 having bipolar NPN transistors (QN) 24 and 25, instead of the current mirror circuit 6 having the N-channel MOS transistors 4 and 5.

Further, as described above, the LED driving circuit 40 of the present embodiment is provided the temperature compensating voltage source 41, the bipolar NPN transistor 42, and the N-channel MOS transistor 43, which are provided as output voltage adjusting means for increasing the amplitude of the output voltage Vd from the inverter 3 with a rise in temperature. However, the output voltage adjusting means is not limited to this. For example, the output voltage adjusting means may be realized by substituting the bipolar NPN transistor 42 with an N-channel MOS transistor.

Embodiment 5

A further embodiment of the present invention is described below with reference to FIG. 6. Note that the same reference numerals and symbols are given to the members that have the same functions as those described in the foregoing embodiment 1, 3 or 4, and descriptions of those members are omitted here as a matter of convenience.

Figure 6:
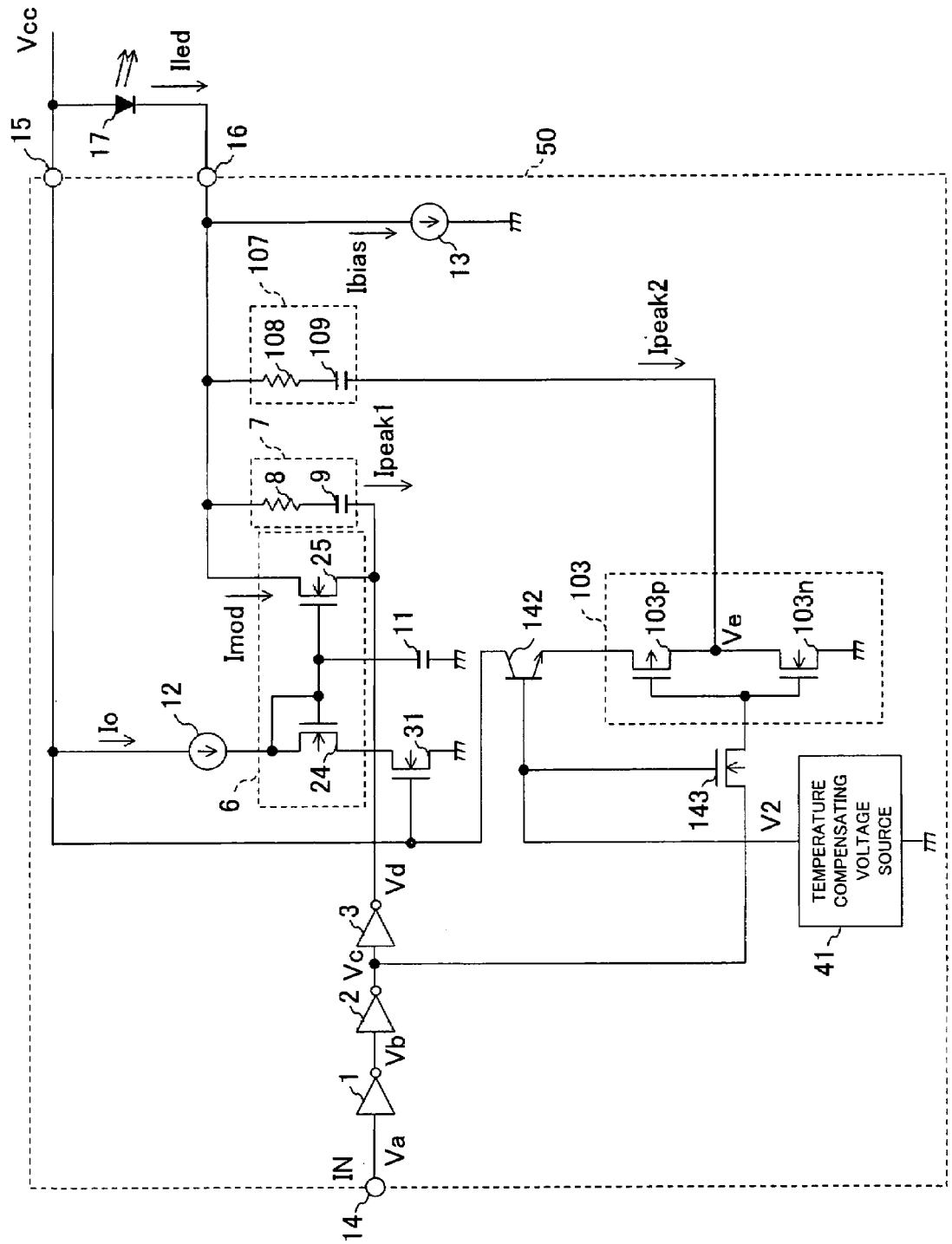
FIG. 6 is a circuit diagram illustrating a configuration of an optical transmitter for use in an optical fiber link according to a fifth embodiment of the present invention.

As shown in FIG. 6, an LED driving circuit 50 of the present embodiment includes, in addition to the peaking circuit 7 for generating a main peaking current Ipeak 1 (peaking current Ipeak), a peaking circuit (peaking circuit for temperature compensation) 107 for generating a sub peaking current Ipeak 2. With the peaking circuit 107, a positive temperature characteristic is given to the sub peaking current Ipeak 2, which allows for fine-tuning of temperature characteristics.

FIG. 6 is a block diagram showing a configuration of the LED driving circuit 50 and an optical transmitter for use in the optical fiber link of the present embodiment. A configuration of the LED driving circuit 50 and the optical transmitter for use in the optical fiber link of the present embodiment is the same as that of an LED driving circuit 30 and an optical transmitter for use in the optical fiber link of the foregoing embodiment 3, except that the LED driving circuit 30 and the optical transmitter for use in the optical fiber link of the present embodiment includes a temperature compensating voltage source 41, an inverter 103 realized by a P-channel MOS transistor 103p and an N-channel MOS transistor 103n, a peaking circuit 107, a bipolar NPN transistor 142, and an N-channel MOS transistor 143.

The inverter 103 and the peaking circuit 107 are respectively connected in parallel to the inverter 3 and the peaking circuit 7, and are respectively configured similarly to the inverter 3 and the peaking circuit 7. More specifically, the inverter 103 includes the P-channel MOS transistor 103p and the N-channel MOS transistor 103n. The gate of the N-channel MOS transistor 103n and the gate of the P-channel MOS transistor 103p are both connected with an input terminal (i.e. output terminal of the inverter 2) via the N-channel MOS transistor 143. The source of the N-channel MOS transistor 103n is grounded, and the drain of the N-channel MOS transistor 103n is connected with the source of the P-channel MOS transistor 103p. The drain of the P-channel MOS transistor 103p is connected with a constant voltage source (not shown) via the bipolar NPN transistor 142 and a power source terminal 15. With this configuration, a peaking current (peaking current for temperature compensation) Ipeak 2 for peaking the currents flowing through the LED 17 is supplied from the peaking circuit 107 to the LED 17 while the LED 17 is ON, in addition to the driving current Imod and peaking current Ipeak 1. The peaking current Ipeak 2 is increased with increase in temperature, so as to prevent a peak value of the peaking current from decreasing as the temperature increases, and thereby prevent a delay in rising or falling of light output (luminous intensity of LED 17) at high temperatures.

Similarly to the bipolar NPN transistor 42 and the N-channel MOS transistor 43 in the foregoing embodiment 4, the bipolar NPN transistor 142 and the N-channel MOS transistor 143 function to carry out temperature compensation for the peaking current by giving temperature characteristics to an amplitude and rise and/or fall time of an output voltage Vd from the inverter 3. More specifically, as shown in FIG. 6, in the LED driving circuit 50 of the present embodiment, in order to prevent a delay in the rising and/or falling of the light output at high temperatures, a power source voltage to the inverter 103 is supplied from the temperature compensating voltage source 41 to the inverter 103 (to the drain of the P-channel MOS transistor 103p) via the base and emitter of the bipolar NPN transistor 142. A voltage Vref outputted from the temperature compensating voltage source 41 has a positive temperature coefficient which increases with increase in temperature. The base of the bipolar NPN transistor 142 is connected with the temperature compensating voltage source 41, the emitter of the bipolar NPN transistor 142 is connected with the drain of the drain of the P-channel MOS transistor 103p, and a collector of the bipolar NPN transistor 142 is connected with the constant voltage source (not shown) via the power supply terminal 15.

Note that, in the present embodiment, it is also possible to use the current mirror circuit 26 having the bipolar NPN transistors (QN) 24 and 25, instead of the current mirror circuit 6 having the N-channel MOS transistors 4 and 5.

Further, as described above, the LED driving circuit 50 of the present embodiment is provided with the temperature compensating voltage source 41, the bipolar NPN transistor 142, and the N-channel MOS transistor 143, which are provided as means for increasing the amplitude of the output voltage Vd from the inverter 103 with increase in temperature. However, the output voltage adjusting means is not particularly limited.

Embodiment 6

Yet still another embodiment of the present invention is described below with reference to FIG. 9. Note that the same reference numerals and symbols are given to the members that have the same functions as those described in the foregoing embodiment 1, 3, 4 or 5, and descriptions of those members are omitted here as a matter of convenience.

The present embodiment is a combination of the foregoing embodiments 4 and 5.

Figure 9:
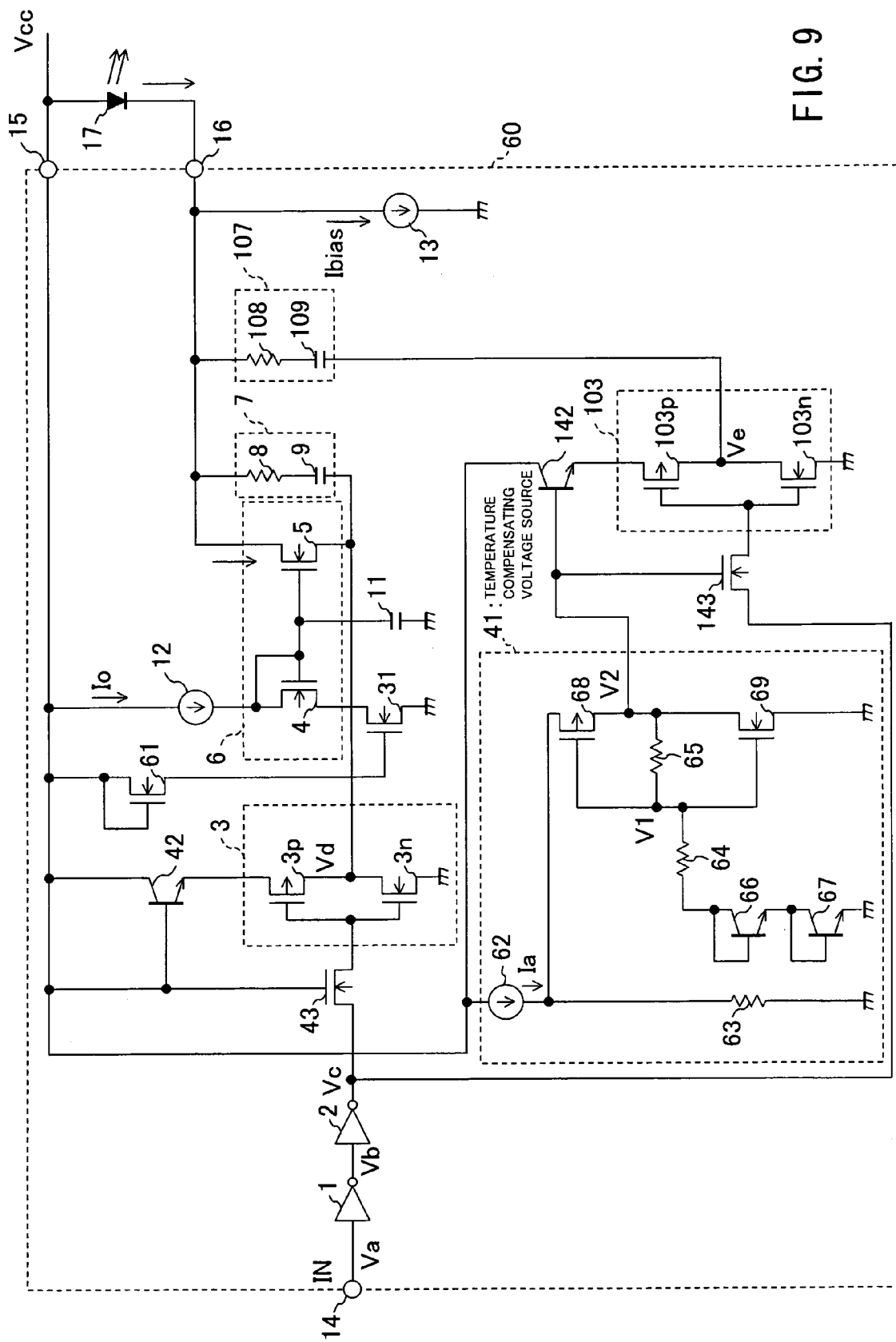
FIG. 9 is a circuit diagram illustrating a configuration of an optical transmitter for use in an optical fiber link according to a sixth embodiment of the present invention.
Figure 10:
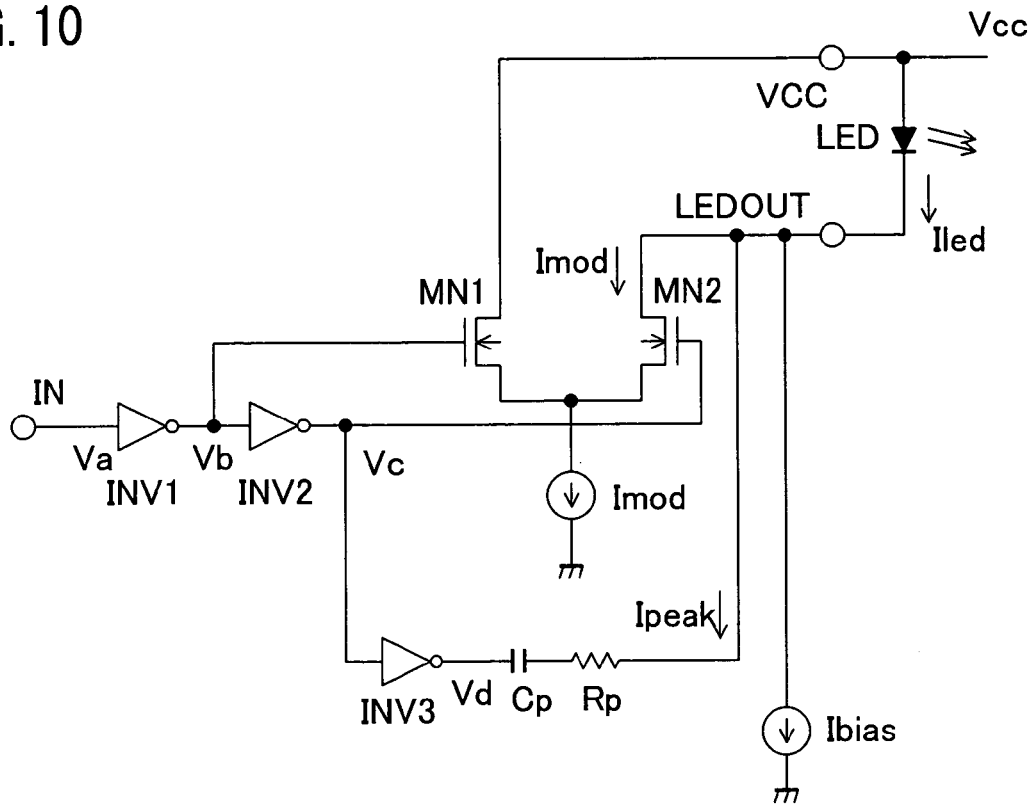
FIG. 10 is a circuit diagram illustrating a configuration of an optical transmitter using a differential drive type LED driving circuit as an example of a conventional LED driving circuit.
Figure 11:
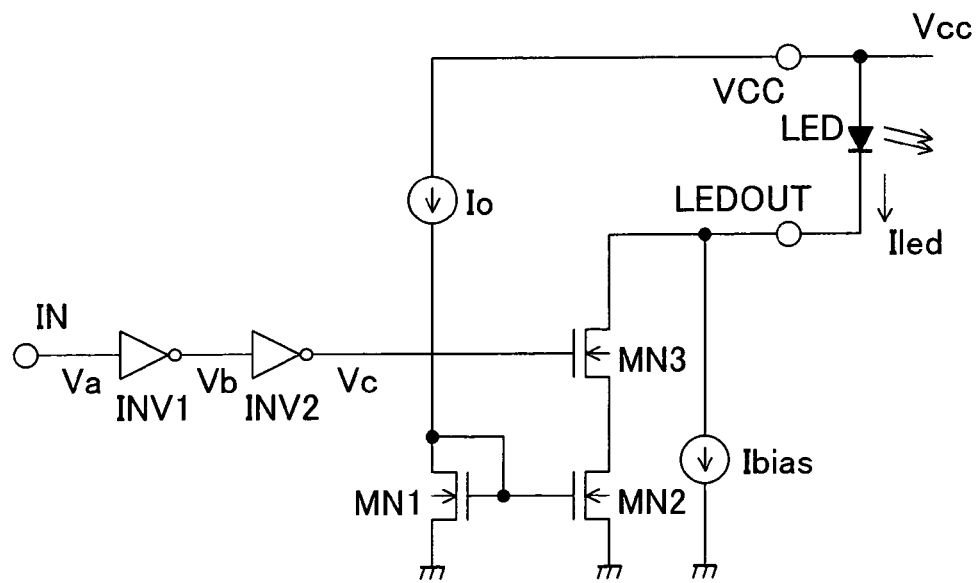
FIG. 11 is a schematic diagram illustrating a configuration of an optical transmitter using a single drive type LED driving circuit as one example of a conventional LED driving circuit.
Figure 12:
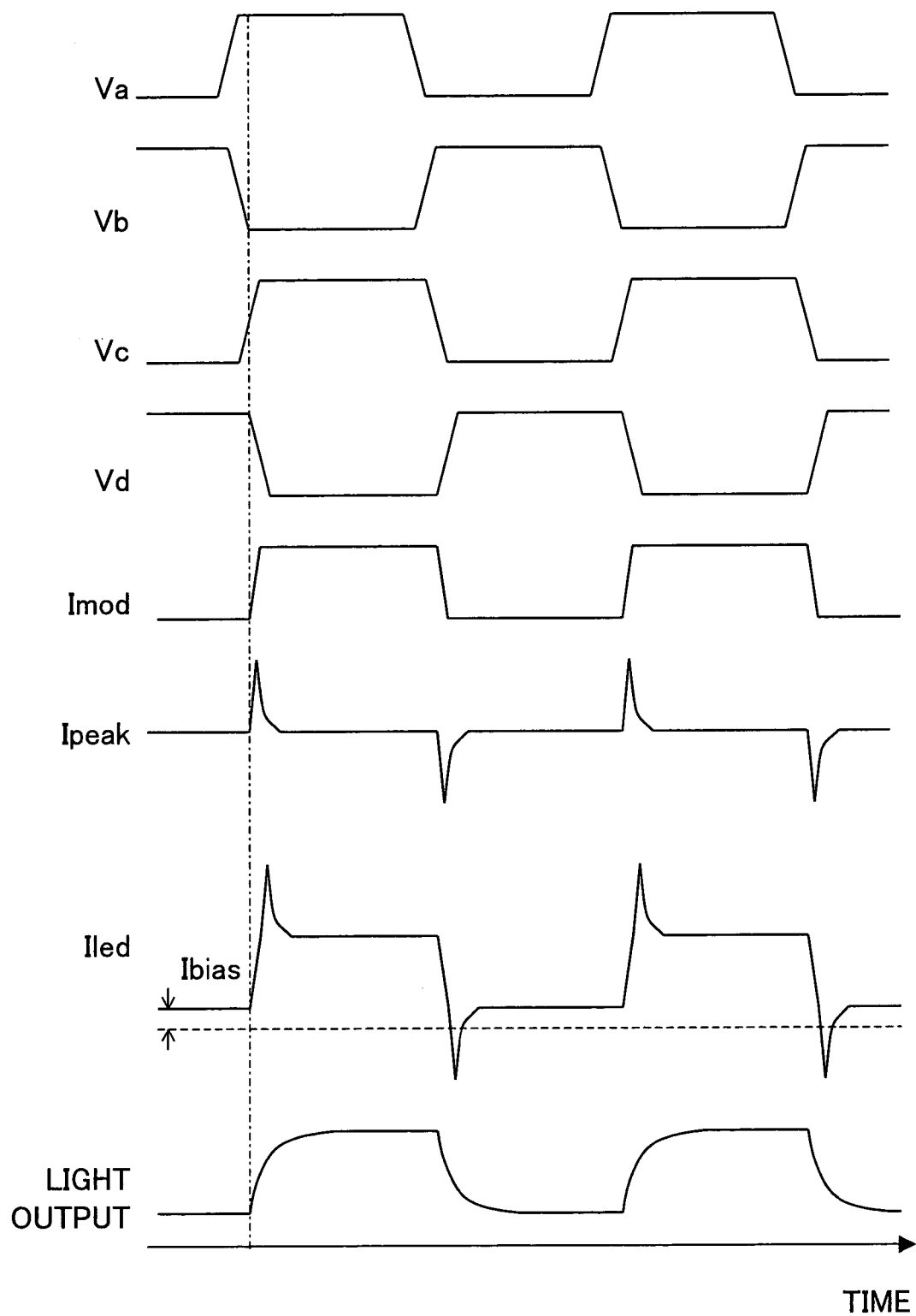
FIG. 12 is a waveform chart illustrating voltage and current waveforms at different points in time, when a rectangular wave signal is inputted in the differential drive type LED driving circuit shown in FIG. 10.
Figure 13:
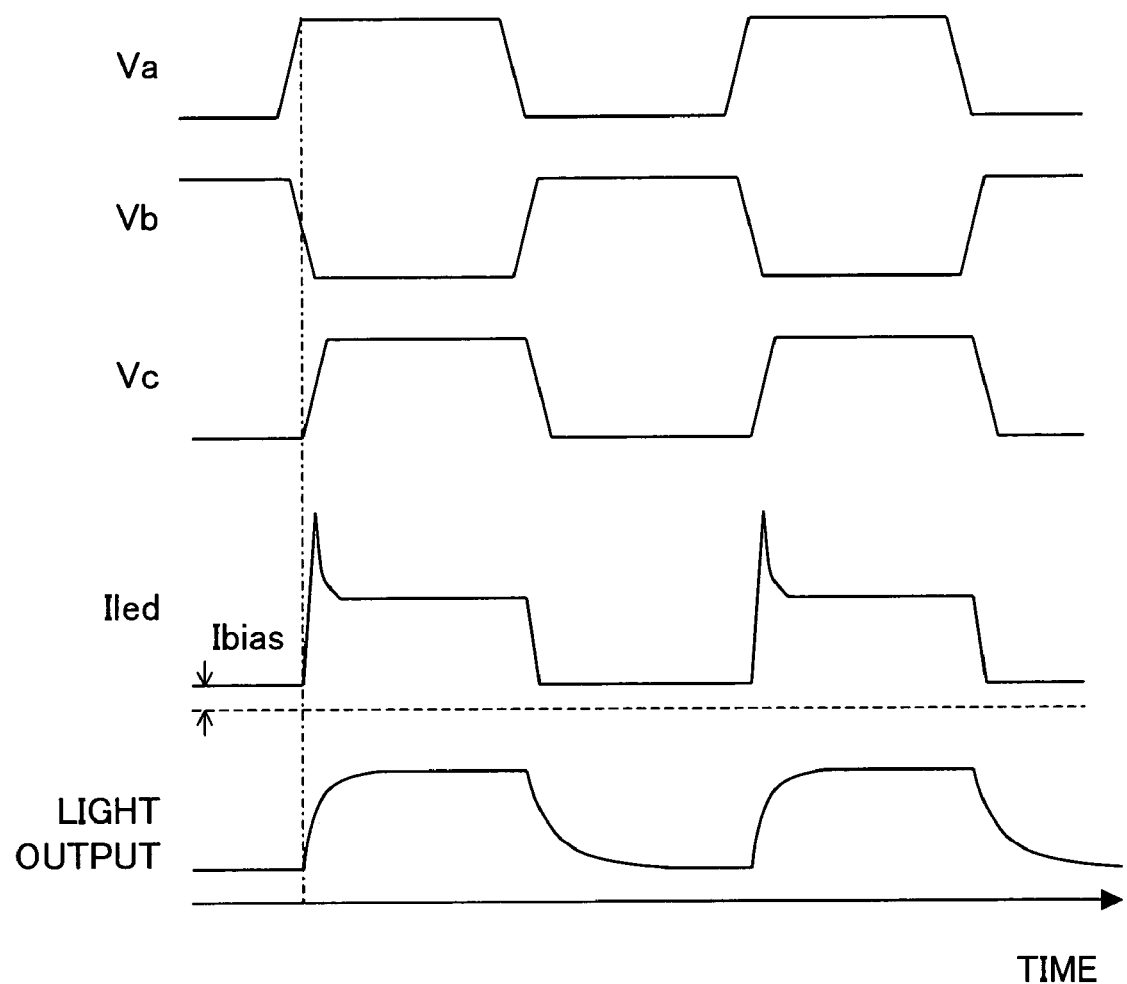
FIG. 13 is a waveform chart illustrating voltage and current waveforms at different points in time, when a rectangular wave signal is inputted in the single drive type LED driving circuit shown in FIG. 11.

FIG. 9 is a block diagram showing a configuration of the LED driving circuit 60 and an optical transmitter for use in the optical fiber link of the present embodiment. The configuration of the LED driving circuit 60 and the optical transmitter for use in the optical fiber link of the present embodiment is the same as that of an LED driving circuit 50 and an optical transmitter of the foregoing embodiment 5 for use in the optical fiber link, except that the LED driving circuit 60 and the optical transmitter for use in the optical fiber link of the present embodiment are provided with a bipolar NPN transistor 42, an N-channel MOS transistor 43, and an N-channel MOS transistor 61. The N-channel MOS transistor 61 is paired with another N-channel MOS transistor 43, so as to provide the same voltage for the N-channel MOS transistor 3n and the N-channel MOS transistor 31, thereby realizing the function to improve the accuracy of a current ratio of currents flowing in the N-channel MOS transistors 4 and 5.

The N-channel MOS transistor 43 and the bipolar NPN transistor 42 function to reduce the difference between a voltage (source voltage of the PMOS 3p) supplied to the inverter 3 and a voltage (source voltage of the PMOS 103p) supplied to the inverter 103, and thereby prevent a long delay between an output timing of the inverter 3 and an output timing of the inverter 103.

Further, a source of the N-channel MOS transistor 61 is connected with a gate of the N-channel MOS transistor 31, and a drain and a gate of the N-channel MOS transistor 61 is connected with the constant voltage source (not shown) via a power source terminal 15 FIG. 9 shows an example of a configuration of a temperature compensating voltage source 41. In the following, it is assumed that the temperature compensating voltage source 41 produces a voltage with a positive temperature characteristic. With a constant current source 62 and a resistor 63, a source voltage of the P-channel MOS transistor 68 is kept substantially constant regardless of a change in temperature. Provided that the P-channel MOS transistor 68 and the N-channel MOS transistor 69 have the same driving capability, a gate voltage Vi of the P-channel MOS transistor 68 is half of the voltage Ia×R1, and remains constant regardless of a change in temperature.

A resistor 65 is connected between the gate and drain of the P-channel MOS transistor 68. A resistor 64 and bipolar NPN transistors 66 and 67 are connected in a diode manner between the gate of the P-channel MOS transistor 68 and GND. A base-emitter voltage Vbe of the bipolar NPN transistor 66 and that of the bipolar NPN transistor 67 have a negative temperature characteristic. For example, if the base-emitter voltage Vbe of the bipolar NPN transistor 66 and that of the bipolar NPN transistor 67 each have a temperature characteristic of $-2$ mV/° C., then the voltages of the bipolar NPN transistors 66 and 67 connected together in a diode manner have a temperature characteristic of $-4$ mV/° C. Here, since the voltage V1 is constant, an increase in temperature causes a current to flow through the resistor 64 at the rate of:

$4/R2$ [mA/° C.], where R2 is the resistance of the resistor 64. When the resistance of the resistor 65 is R3 [Ω], the drain voltage V2 of the P-channel MOS transistor 68 is:

$4 \times (R3/R2)$ [mV/° C.].

In consideration of temperature characteristics of Vbe of the 142, the power source voltage Ve of the inverter 103 having the P-channel MOS transistor 103p and the N-channel MOS transistor 103n becomes:

$4 \times (R3/R2) + 2$ [mV/° C.], yielding a positive temperature coefficient.

Further, similar to the foregoing embodiment 5, in the present embodiment, it is possible to carry out the temperature compensation for the peaking amount by connecting the inverter 103 with a cathode of the LED 17 via the peaking circuit 107 for the temperature compensation having serially-connected capacitor 108 and resistor 109.

It should be noted that the temperature compensating voltage source 41 is not limited to the one shown in FIG. 9, provided that the voltage supplied therefrom exhibits a positive temperature characteristic.

Further, in the present embodiment, it is also possible to use the current mirror circuit 26 having the bipolar NPN transistors (QN) 24 and 25, instead of the current mirror circuit 6 having N-channel MOS transistors 4 and 5.

Further, the capacitor 11, which is provided in all of the optical transmitters of the foregoing embodiments, may be omitted. Further, the LED driving circuits of the respective embodiments are provided with a bias current source 13; however, the bias current source 13 can also be omitted.

Further, all of the optical transmitters in the respective embodiments have three stages of inverters 1 to 3; however, the number of the inverters provided is not limited. However, in the case where an even number of inverters are provided, it is necessary that a signal to be inputted to the LED driving circuit be an inverted signal of the input electronic signal IN of the respective embodiments. Further, in the LED driving circuits of the foregoing embodiments 1 and 2, it is possible to omit the three stages of inverters 1 to 3 altogether; however, in this case it is necessary that the signal to be inputted to the LED driving circuit be an inverted signal of the input electronic signal IN of the foregoing embodiments 1 and 2.

Further, the peaking circuits (7, 107) of the respective embodiments include a resistor and a capacitor serially connected with each other; however, a configuration of the peaking circuit is not limited to this, and the peaking circuit may include only the capacitor.

Further, in each of the foregoing embodiments, a constant current source 12 is provided in the LED driving circuit. However, the constant current source 12 may be provided outside the LED driving circuit.

The present invention is not limited to the embodiments above, and may be altered within the scope of the claims. An embodiment based on a suitable combination of the various technical means disclosed in the described embodiments is encompassed in the technical scope of the present invention.

As described, a light emitting diode driving circuit of the present invention includes (a) a current mirror circuit having a first MOS transistor and a second MOS transistor whose respective gates are connected with each other; (b) a current supplying section for supplying, to the first MOS transistor, a current for driving a light emitting diode; (c) a light emitting diode connection terminal, connected with the second MOS transistor, for connecting the light emitting diode; (d) an ON/OFF signal input section for inputting, to a source of the second MOS transistor, an ON/OFF signal for controlling ON/OFF of the light emitting diode; and (e) a peaking circuit, connected with a drain and a source of the second MOS transistor, for generating a peaking current used in peaking a current flowing through the light emitting diode. Further, as described, a light emitting diode driving circuit comprising of the present invention includes: (a) a current mirror circuit having a first bipolar transistor and a second bipolar transistor whose respective gates are connected with each other; (b) a current supplying section for supplying, to the first bipolar transistor, a driving current for driving a light emitting diode; (c) a light emitting diode connection terminal, connected with the second bipolar transistor, for connecting the light emitting diode; (d) an ON/OFF signal input section for inputting, to an emitter of the second bipolar transistor, an ON/OFF signal for controlling ON/ OFF of the light emitting diode; and (e) a peaking circuit, connected with a collector and the emitter of the second bipolar transistor, for generating a peaking current used in peaking a current flowing through the light emitting diode.

Further, the light emitting diode driving circuit of the present invention having the first and the second MOS transistors may further include (a) an inverter, provided in the ON/OFF signal input section, for inverting the ON/OFF signal; and (b) a third MOS transistor, connected with the first MOS transistor, for compensating for a deviation of a drain-source current of the second MOS transistor caused by an ON-resistance of the inverter.

Further, the light emitting diode driving circuit of the present invention having the first and the second bipolar transistors may further include (a) an inverter, provided in the ON/OFF signal input section, for inverting the ON/OFF signal; and (b) a third MOS transistor, connected with the first bipolar transistor, for compensating for a deviation of a collector-emitter current of the second bipolar transistor caused by an ON-resistance of the inverter.

With the foregoing structure, it is possible to compensate for a deviation of a drain- source current of the second MOS transistor, or a deviation of a collector-emitter current of the second bipolar transistor, each caused by the on-resistance of the inverter. This enables an accurate adjustment of a current value of a drain-source current of the second MOS transistor or a current value of a collector-emitter current of the second bipolar transistor. As a result, it is possible to accurately adjust a light emitting diode driving current.

Further, the light emitting diode driving circuit of the present invention having the third MOS transistor may further include a temperature-compensating voltage source, directly or indirectly connected with a gate of the third MOS transistor, for producing a voltage that increases as temperature increases.

Further, the light emitting diode driving circuit of the present invention having the first and the second bipolar transistors or the first and the second MOS transistors may further include current controlling means for controlling a current supplied from the current supplying section and flowing through the current mirror circuit, the current being controlled so that its current value increases as temperature increases.

Further, the light emitting diode driving circuit of the present invention having the first and the second bipolar transistors or the first and the second MOS transistors may be adapted so that the ON/OFF signal input section includes: (a) an inverter for generating the ON/OFF signal by inverting an inverted ON/OFF signal of the ON/OFF signal; and (b) output voltage adjusting means for causing an amplitude of an output voltage of the inverter to increase as temperature increases.

In a preferred embodiment of the light emitting diode driving circuit having the inverter and the output voltage adjusting means, (I) the ON/OFF signal inputting section includes an inverted ON/OFF signal supplying section for supplying the inverted ON/OFF signal of the ON/OFF signal to the inverter (e.g. in the case where a plurality of the inverters are provided, the inverted on/off signal supplying section is an inverter on a front side). In the foregoing configuration, it is more preferable that the second adjusting transistor be interposed between the power source for supplying the power source voltage and the power source voltage inputting end of the inverter, and that the control terminal (a gate or a base) of the second adjusting transistor is connected with the temperature compensation type voltage source.

In another preferred embodiment of the light emitting diode driving circuit having the inverter and the output voltage adjusting means, the output voltage adjusting means includes: (I) a temperature-compensating voltage source for producing a voltage that increases as temperature increases; and (II) a second adjusting transistor, interposed between (a) a power source for supplying power to the inverter and (b) a power source voltage input terminal of the inverter, including a control terminal (a gate or a base) connected with the temperature-compensating voltage source.

Note that the first adjusting transistor is preferably an N-channel MOS transistor including a gate connected with the temperature compensating voltage source, for inputting, to the inverter, the inverted on/off signal from the inverted on/off signal supplying section via a drain and a source of the first adjusting transistor. Further, the second adjusting transistor is preferably a bipolar NPN adjusting transistor including the base connected with the temperature compensating voltage source, and emitter thereof connected with the power source voltage inputting end of the inverter.

Further, the light emitting diode driving circuit of the present invention having the first and the second bipolar transistors or the first and the second MOS transistors may include a temperature-compensating peaking circuit, connected in parallel to the peaking circuit, for generating a temperature-compensating peaking current for peaking the current flowing through the light emitting diode, the temperature-compensating peaking current being generated so that its current value increases with increase in temperature.

With the foregoing configurations including the temperature compensating voltage source, the current control means, and the output voltage adjusting means or the peaking circuit for use in temperature compensation, it is possible to prevent a peak value of the peaking current from decreasing as the temperature increases. This prevents a delay in the rising and/or falling of light output (luminous intensity) with increase in temperature. As a result, it is possible to provide a light emitting diode driving circuit that is advantageous in terms of response speed and power consumption, and that can operate over a wide temperature range.

In order to solve the foregoing problems, an optical transmitter for use in an optical fiber link according to the present invention includes a light emitting diode and a light emitting diode driving circuit having any one of the foregoing configurations. Thus, it is possible to provide an optical transmitter for use in an optical fiber link, in which low current consumption and a fast response speed for LED can easily be attained.

The present invention can suitably be applied to an optical transmitter for an optical fiber link, for example, such as an optical transmitter for use in digital audio equipment, an optical transmitter for use in an in-vehicle optical fiber link, and an optical transmitter for use in a high-speed photocoupler. The present invention can also suitably be applied to a low-power-consuming and fast-response light emitting diode driving circuit suitable for such an optical transmitter.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A light emitting diode driving circuit comprising:
   a current mirror circuit having a first MOS transistor and a second MOS transistor whose respective gates are connected with each other;
   a current supplying section for supplying, to the first MOS transistor, a current for driving a light emitting diode;
   a light emitting diode connection terminal, connected with the second MOS transistor, for connecting the light emitting diode;
   an ON/OFF signal input section for inputting, to a source of the second MOS transistor, an ON/OFF signal for controlling ON/OFF of the light emitting diode; and
   a peaking circuit, connected with a drain and a source of the second MOS transistor, for generating a peaking current used in peaking a current flowing through the light emitting diode.

2. The light emitting diode driving circuit as set forth in claim 1, further comprising:
   an inverter, provided in the ON/OFF signal input section, for inverting the ON/OFF signal; and
   a third MOS transistor, connected with the first MOS transistor, for compensating for a deviation of a drain-source current of the second MOS transistor caused by an ON-resistance of the inverter.

3. The light emitting diode driving circuit as set forth in claim 2, further comprising:
   a temperature-compensating voltage source, directly or indirectly connected with a gate of the third MOS transistor, for producing a voltage that increases as temperature increases.

4. The light emitting diode driving circuit as set forth in claim 1, further comprising:
   current controlling means for controlling a current supplied from the current supplying section and flowing through the current mirror circuit, the current being controlled so that its current value increases as temperature increases.

5. The light emitting diode driving circuit as set forth in claim 1, wherein the ON/OFF signal input section includes:

an inverter for generating the ON/OFF signal by inverting an inverted ON/OFF signal of the ON/OFF signal; and output voltage adjusting means for causing an amplitude of an output voltage of the inverter to increase as temperature increases.

6. The light emitting diode driving circuit as set forth in claim 5, wherein:

the ON/OFF signal inputting section includes an inverted ON/OFF signal supplying section for supplying the inverted ON/OFF signal of the ON/OFF signal to the inverter; and the output voltage adjusting means includes:

a temperature-compensating voltage source for producing a voltage that increases as temperature increases;

a first adjusting transistor, interposed between the inverted ON/OFF signal supplying section and an input terminal of the inverter;

a second adjusting transistor, interposed between (a) a power source for supplying power voltage to the inverter and (b) a power source voltage input terminal of the inverter, including a control terminal connected with the temperature-compensating voltage source.

7. The light emitting diode driving circuit as set forth in claim 1, further comprising:

a temperature-compensating peaking circuit, connected in parallel to the peaking circuit, for generating a temperature-compensating peaking current for peaking the current flowing through the light emitting diode, the temperature-compensating peaking current being generated so that its current value increases with increase in temperature.

8. An optical transmitter for use in an optical fiber link, comprising a light emitting diode; and a light emitting diode driving circuit including:

a current mirror circuit having a first MOS transistor and a second MOS transistor whose respective gates are connected with each other;

a current supplying section for supplying, to the first MOS transistor, a current for driving the light emitting diode;

a light emitting diode connection terminal, connected with the second MOS transistor, for connecting the light emitting diode;

an ON/OFF signal input section for inputting, to a source of the second MOS transistor, an ON/OFF signal for controlling ON/OFF of the light emitting diode; and a peaking circuit, connected with a drain and a source of the second MOS transistor, for generating a peaking current used in peaking a current flowing through the light emitting diode.

* * * * *